(12) United States Patent
Richter et al.

(10) Patent No.: US 12,232,460 B2
(45) Date of Patent: Feb. 25, 2025

(54) SYSTEM AND A METHOD FOR INTERACTING WITH FLORAL OBJECTS

(71) Applicants: Wolfgang Richter, Vancouver (CA); Faranak Zadeh, Vancouver (CA)

(72) Inventors: Wolfgang Richter, Vancouver (CA); Faranak Zadeh, Vancouver (CA)

(73) Assignee: EPIC SEMICONDUCTORS INC

( * ) Notice: Subject to any disclaimer, the term of this patent is extended or adjusted under 35 U.S.C. 154(b) by 531 days.

(21) Appl. No.: 17/824,227

(22) Filed: May 25, 2022

(65) Prior Publication Data

US 2022/0322609 A1 Oct. 13, 2022

Related U.S. Application Data

(60) Provisional application No. 63/172,816, filed on Apr. 9, 2021.

(51) Int. Cl.
| | |
|---|---|
| *A01G 7/04* | (2006.01) |
| *G01M 15/04* | (2006.01) |
| *G01M 15/06* | (2006.01) |
| *G01R 27/04* | (2006.01) |
| *G01R 29/08* | (2006.01) |
| *H02J 50/05* | (2016.01) |
| *H04B 5/79* | (2024.01) |
| *F02B 77/08* | (2006.01) |

(52) U.S. Cl.
CPC ............. *A01G 7/04* (2013.01); *G01M 15/042* (2013.01); *G01M 15/06* (2013.01); *G01R 27/04* (2013.01); *G01R 29/0871* (2013.01); *H02J 50/05* (2016.02); *H04B 5/79* (2024.01); *F02B 77/083* (2013.01)

(58) Field of Classification Search
CPC ........ A01G 7/04; A01G 9/26; G01N 33/0098; H04B 5/79; H02J 50/05
See application file for complete search history.

(56) References Cited

U.S. PATENT DOCUMENTS

| | | | |
|---|---|---|---|
| 2020/0302338 A1* | 9/2020 | Carroll | ................... G06N 20/10 |
| 2024/0295526 A1* | 9/2024 | Zamanzadeh | ...... G01N 33/0098 |

FOREIGN PATENT DOCUMENTS

| | | | | |
|---|---|---|---|---|
| CN | 112930919 A | * | 6/2021 | ............... A01G 7/04 |
| WO | WO-2017032750 A1 | * | 3/2017 | ............... A01G 7/00 |
| WO | WO-2022013040 A1 | * | 1/2022 | ............... A01G 7/00 |
| WO | WO-2022150328 A1 | * | 7/2022 | ............... A01G 7/00 |

\* cited by examiner

*Primary Examiner* — Trinh T Nguyen

(57) ABSTRACT

Disclosed is a method and a system for stimulating and communicating with floral objects. The system includes a base unit for communicating with the floral objects to read and stimulating physical and biological properties, and an electronic circuitry configured to be placed in reach of the floral objects. The electronic circuitry is capacitively coupled to the base unit and the floral objects. The base unit is able to create and communicate stimulated patterns to stimulate growth, biological properties of the floral object. The base unit generates stimulated pattern on receiving information and data from the electronic circuitry.

16 Claims, 2 Drawing Sheets

SYSTEM AND A METHOD FOR INTERACTING WITH FLORAL OBJECTS

CROSS REFERENCE TO RELATED APPLICATION

The present application claims the benefit of U.S. Provisional Application No. 63/172,816, filed May 25, 2021, which is incorporated by reference herein in its entirety.

BACKGROUND OF THE INVENTION

1. Field of the Invention

The present invention generally relates to a system and a method for interacting with floral objects, and more particularly relates to a system and a method for contactless harvesting and transporting electrical energy through the floral object to classify, predict, alert environmental changes and enhance physical and biological properties of the floral objects.

2. Description of Related Art

Plants are our symbiotic saviors, as they bind carbon dioxide and produce oxygen due to photosynthesis. Yet, they are also sensitive to environmental and climate changes and have developed defense mechanisms we could learn from what is good for them and for us. Floral objects like plants, from algae, flowers, crops, up to trees, can contactless harvest and transport electrical energy and data due to electron entanglement without the use of (often toxic) lithium battery button cells and electromagnetic waves' smog.

The cells of plants, animals and humans all use electrical signals to communicate with each other. Nerve cells use them to activated muscles. But leaves, too, send electrical signals to other parts of the plant, for example, when they were injured and are threatened by hungry insects.

Cell communication during patterning in plants is carried out via a unique and intricate mechanism. Plants use "small RNAs" as mobile signals. Small RNAs are known for their role in defense mechanisms against herbivores or disease pathogens, and also shows that cells in the leaf take on the correct identity in space and time. Small RNAs enable fine-tuned regulation of protein production and therefore also developmental processes in the plant cells.

Molecules interact because they are entangled via the binding forces of electrons. The "Brownian motion" creates patterns depending on temperature, consistency of gasses (like the air), physical and (bio-) chemical reactions. A simple electrode can "mirror" electrical charges that come along with those patterns, in this case, emitted from a plant that reacts to the environment. Amplified, filtered, and sampled, a machine learning algorithm may be trained with those patterns to classify, predict, and alert environmental changes as well as to create and provide biofeedback for the floral object.

Plants are multiple organic environ-"mental" (microfluidic) sensors! As they build communities (e.g. like a forest or a corn (crop, vegetable, etc.) field, in a garden, greenhouse, etc.), they also create a natural communication network where information propagates from one plant to another. Wildfires, flooding, landslides, pests, carbon dioxide impact etc. may be much quicker detected, predicted, prevented, and defended.

Therefore, there is a need for a system and a method for stimulating and communicating with floral objects. Further, the system and the method for contactless harvesting and transporting electrical energy and signals through the floral object to classify, predict and alert environmental changes. Further, the system and the method should provide means to stimulate the plant to grow faster or larger, to bind more carbon and release more oxygen or be more resistant in general.

SUMMARY OF THE INVENTION

In accordance with teachings of the present invention a system for contactless, harvesting and transporting electrical energy through a floral object is provided.

An object of the present invention is to provide a system with a base unit for communicating with the floral objects to read and stimulate physical and biological properties, and an electronic circuitry capacitively coupled to the base unit and the floral objects.

The base unit includes a generator for generating controllable frequency, a controller for releasing monitor commands and patterns to stimulate the floral objects, a mixer for mixing the controllable frequency with the commands and the patterns, an emitting electrode for emitting the mixed frequency with commands and patterns as an alternating electric field, and an interface unit for communicating processed information over a communication network.

The electronic circuitry includes a coupling electrode influenced by the alternating electric field received from the emitting electrode, a power converter for converting the alternating electric field into a DC energy, a sensing circuitry to amplify bioelectric patterns received from the floral objects transported via the alternating electric field, a communication modem circuitry to extract the commands received from the controller via the alternating electric field; further the communication modem circuitry modulates the alternating electric fields with the amplified bioelectric pattern, and a processing unit to interpret the extracted commands to adjust the amplification and filter values in the sensing circuitry in preparation to prepare the controller for stimulation of the floral objects.

The controller then generates a stimulation pattern mixed the frequency by the mixer, wherein the emitting electrode emits the mixed stimulation pattern via the alternating electric field into the floral objects. The stimulation pattern stimulates the growth of the floral objects.

Another object of the present invention is to provide the electronic circuitry with a buffer to store the converted DC energy, further the buffer removes ripples caused by the alternating electric field's frequency, and with one or more light emitting diodes to visualize operational status of the electronic circuitry.

Another object of the present invention is to provide the controller which is programmed with artificial intelligence to automatically create stimulation patterns based on the bioelectric patterns received by the sensing circuitry and interpret by the processing unit.

Another object of the present invention is to provide the system wherein the sensing circuit senses environmental changes affecting the floral objects, wherein the sensed environmental changes are communicated to the controller via the communication modem circuitry over the alternating electric field.

Another object of the present invention is to provide the system wherein the stimulation patterns released from the controller enhances the growth of the floral objects naturally, attracts insects in reach of the alternating electric field for fertilizing the floral objects, and repels harmful pests in reach of the alternating electric field to protect the floral objects.

Another object of the present invention is to provide the system wherein the stimulation patterns released from the controller enhances properties of the floral object to bind more carbon dioxide and further enhances properties of the floral object to release more oxygen.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF DRAWINGS

The annexed drawings, which are not necessarily to scale, show various aspects of the inventions in which similar reference numerals are used to indicate the same or similar parts in the various views.

DETAILED DESCRIPTION OF DRAWINGS

Figure 1:
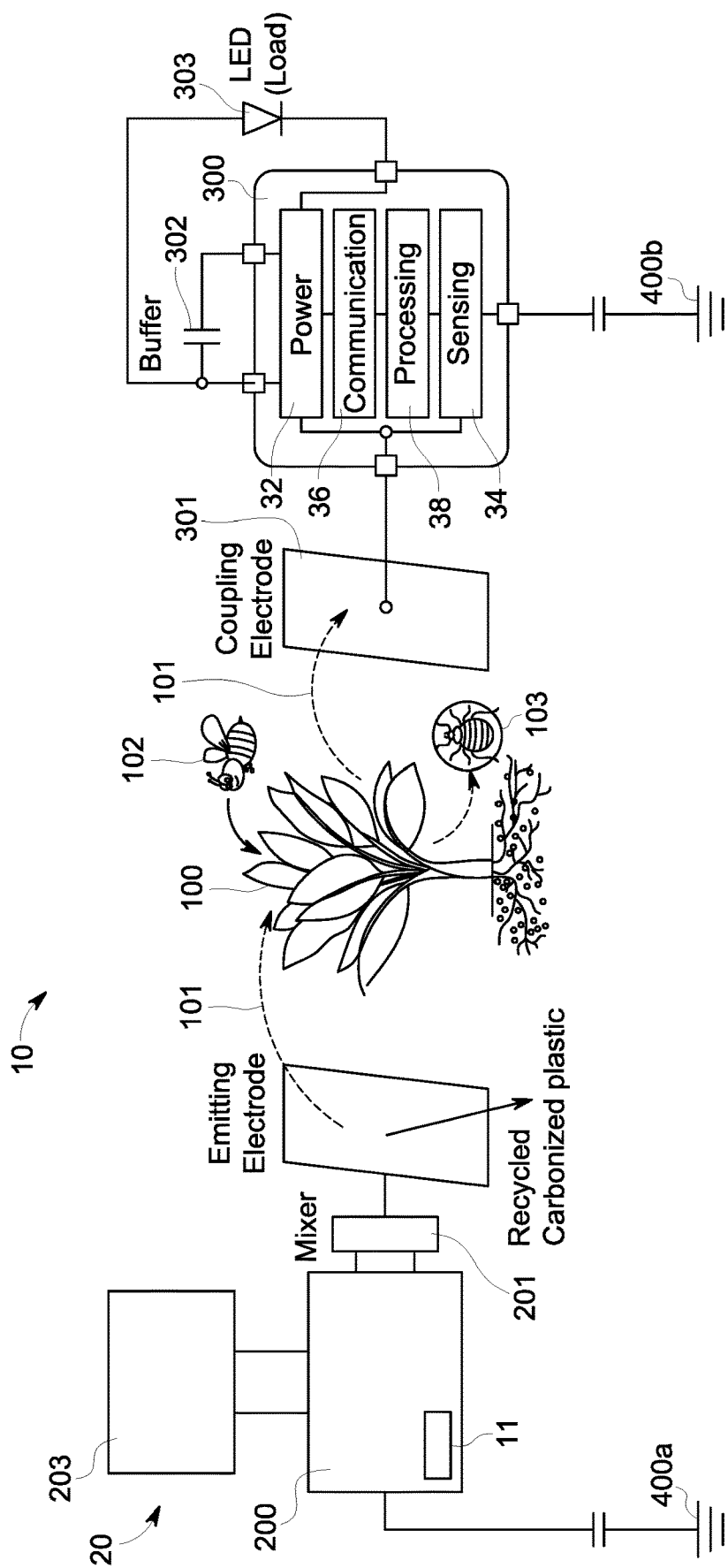
FIG. 1 illustrates a schematic diagram of a system for contactless, harvesting and transporting electrical energy through a floral object.

While this technology is illustrated and described in a preferred embodiment of a system for contactless, harvesting and transporting electrical energy through a floral object that may be produced in many different configurations, forms and materials. There is depicted in the drawings, and will herein be described in detail, as a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the technology described herein.

FIG. 1 illustrates a schematic diagram of a system 10 for stimulating and communicating with floral objects 100. The system 10 includes a base unit 20 and an electronic circuitry 300 capacitively coupled to the base unit 20. The base unit 20 communicates with the floral objects 100 to read and stimulating physical and biological properties of the floral object 100. The electronic circuitry 300 is configured to be placed in reach of the floral objects 100.

The electronic circuitry 300 is capacitively coupled to the base unit 20 and the floral objects 100. The base unit 20 includes a generator 11 for generating controllable frequency, a controller 200 for releasing monitor commands and patterns to stimulate floral objects, a mixer 201 for mixing the controllable frequency with commands and the patterns, an emitting electrode 202 for emitting the mixed frequency with commands and patterns as an alternating electric field 101, and an interface unit 203 for communicating processed information over a communication network.

The electronic circuitry 300 includes a coupling electrode 301 influenced by the alternating electric field received from the emitting electrode 202, a power converter 32 for converting the alternating electric field 101 into a DC energy, a sensing circuitry 34 to amplify bioelectric patterns received from the floral objects 100 transported via the alternating electric field 101, a communication modem circuitry 36 to extract the commands received from the controller 200 via the alternating electric field 101. Further the communication modem circuitry 36 modulates the alternating electric field 101 with the amplified bioelectric pattern.

The electronic circuitry 300 includes a processing unit 38 to interpret the extracted commands to adjust the amplification and filter values in the sensing circuitry 34 in preparation to prepare the controller 200 for stimulation of the floral objects 100. The controller 200 generates a stimulation pattern mixed the frequency by the mixer 201, wherein the emitting electrode 202 emits the mixed stimulation pattern via the alternating electric field 101 into the floral objects 100.

In another embodiment of the present invention, the electronic circuitry 300 further includes a buffer 302 to store the converted DC energy. Further, the buffer 302 stores the converted DC energy. Further, the buffer 302 removes ripples caused by the alternating electric field's frequency.

In another embodiment of the present invention, the system 10 further includes a light emitting diode 303 to visualize operational status of the electronic circuitry 300. Further, the controller 200 is programmed with artificial intelligence to create stimulation patterns. The controller 200 stores each bioelectrical pattern monitored and read by the sensing circuit 34. With the help of artificial intelligence, the controller 200 is programmed to release the right stimulating pattern to bioelectrical stimulate the floral object 100.

For exemplary purposes, the controller 200 records the stimulating pattern to grow the floral object 200 or to repel a bug 103 or to attract a bee 102, and similarly other stimulating patterns are created in the controller 200, wherein the sensing circuit 34 analyses or monitors the bioelectrical pattern released from the floral object 100

The sensing circuit 34 regularly senses the change in the alternating electric field around the floral object 100 to monitor the bioelectrical patterns, and then amplifies the bioelectric patterns. The base unit 20, the floral object 100 and the electronic circuity 300 are in a bio-feedback loop to control stimulations in near real time.

Further in another embodiment, the sensing circuit senses environmental changes affecting the floral objects 100. The sensed environmental changes are communicated to the controller 200 via the communication modem circuitry 36 over the alternating electric field 101.

In an exemplary embodiment, the stimulation patterns are released from the controller 200 attracts insects 102 in reach of the alternating electric field 101 for fertilizing the floral objects 100. Further, the stimulation patterns are released from the controller 200 to repel harmful pests 103 in reach of the alternating electric field to protect the floral objects 100.

In an exemplary embodiment, the stimulation patterns are released from the controller 200 to enhance properties of the floral object to bind more carbon dioxide, and further the stimulation patterns are released from the controller 200 to enhance properties of the floral object 100 to release more oxygen.

The emitting electrode 202 and the coupling electrode 301 consist of (preferably recycled) conductive polymers or rubber in a preferably flexible flat form (or similar conductive materials). The electronic circuitry 300 converts electrical power and clock signals from the alternating electric field 101 and separates and processes bioelectric signals that the floral object 100 modulates into the alternating electric field 101 similar to an EEG. The bioelectric signals reflect the plant's environmental state, caused by climate and/or photosynthesis.

The electronic circuitry 300 has means to change the electrical load which back propagates over the floral object 100 and the emitting electrode 202 to be received by at least one of the floral object 100 or the mixer 201. Further, the mixer 201 sends the received bioelectric signal patterns as data to the controller 200 for further processing.

The interface unit 203 is able to connect with display units like LED, OLED etc. computers, electronic devices or communication networks such as LAN, Wi-Fi, BLE, 5G, GPS, etc. The electronic circuitry 300 is also able to sense the appearance of insects or microorganisms in reach of the alternating electric field (101) and decide between a beneficial organism and vermin.

In a preferred embodiment, the coupling electrode 301 and related electronic circuitry 300 comes combined as a sticker or pedant, attached to the floral object 100. As it gets powered by the base unit 20 via the floral object 100 via electron entanglement, therefore it doesn't require a battery. To scan a larger array of plants (e.g. crops) the base unit 20 are attached to drones (or farm machines).

Example of the controller 200 includes but not limited to a flexible programmable gate arrays (FPGA), microcontrollers, digital and analog sub-circuits etc. The controller 200 is able to remotely control hundreds of such battery-free smart electrodes attached to floral objects in reach!

The controller 200 toggles an output pin with <500 kHz (PWM). The mixer 201 filters the rectangle into a sine wave that resonates at a higher level (e.g. 100 eV), which emits a weak alternating (non-magnetic!) electric field via a preferably recycled polymer electrode (<10 mW). The floral object 100 is equipped with the electronic circuitry 300 in reach are influenced and couple the field with the attached coupling electrodes 301.

The electronic circuitry 300 harvests DC from the capacitively coupling, while the floral object 100 modulates the electric field with a biological pattern that represents its state (similar to an EEG for brain waves). The base unit 20 and the electronic circuitry 300 are grounded via a ground electrode 400*a* and a second ground electrode 400*b* respectively.

Examples of the floral objects 100 include but not limited to plants, trees, flowers, crops, algae, vegetables, fruits etc. Examples of the invited insects include but not limited to bees, butterfly, or other similar and useful for fertilization. Examples of the harmful insects include but not limited to leeches, bugs, vermin, pests etc.

Examples of the generator 11 include but not limited to oscillators, PWM, toggled I/O pins, PLL, etc. Examples of the mixer 201 include but not limited to diodes, Graetz, Gilbert-Cells, multiplier, AM, FM, IQ, etc. Examples of the power converter 32 include but not limited to a rectifier, harvester, cascade, transformer, diodes, electronic switches etc.

Examples of sensing circuitry 34 include but not limited to an operational amplifier, filter, instrumentation amplifier, buffer, inverter, multiplier, logarithmic amplifier, etc. Examples of the communication modem circuitry 36 include impedance converter, peak-detector, passive resistor/capacitor network, MOSFET, attenuator, level shifter, frequency selector, etc.

Examples of the processing unit 38 include but not limited to a programmable logic circuits, MCU's, digital calculator, ALU, neural network, etc. Examples of the buffer 302 include but not limited to a capacitor, gold-cap, accumulator, etc. Examples of the light emitting diode (LED) 303 include but not limited to OLED, LCD, and any other optical signal units. It would be readily apparent to those skilled in the art that LED 303 may be interchangeably used as any output device such as speakers, buzzers or any audio-visual units to release status information.

Figure 2:
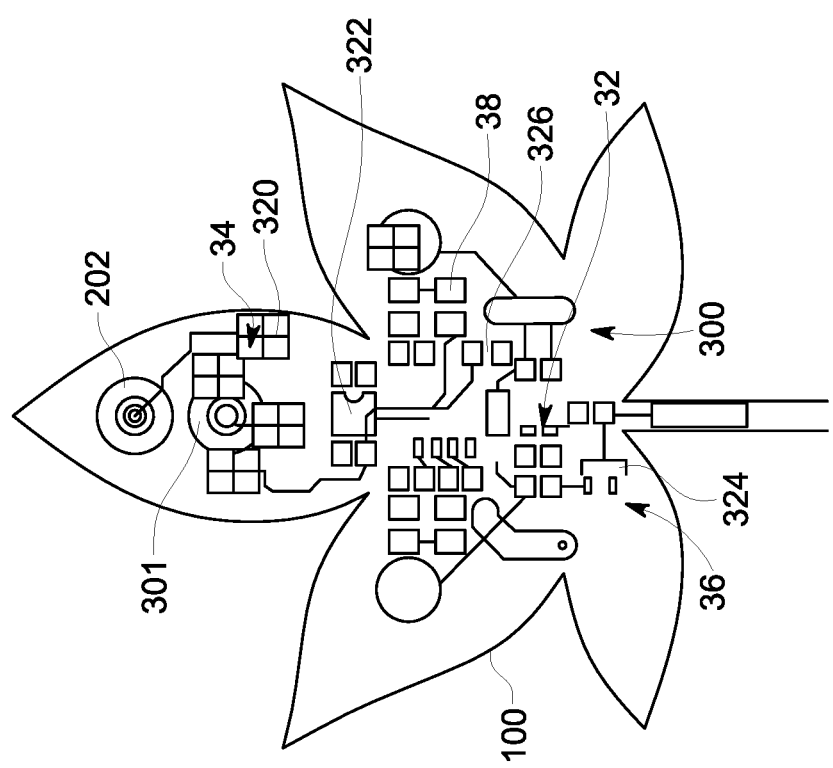
FIG. 2 illustrates a circuit arrangement diagram of the electronic circuitry attached to the floral object.

FIG. 2 illustrates a circuit arrangement diagram of the electronic circuitry 300 attached to the floral object 100. The sensing circuitry 34 further includes a programmable gain amplifier 320 and an instrumentation amplifier 322. The programmable gain amplifier 320 and the instrumentation amplifier 322 receives the floral object 100 bioelectric modulation while suppressing the alternating electric field's level and frequency (CMRR).

The communication modem circuitry 36 includes a modulator 324 for modulating the alternating electric field with the floral object 100 state values and a unique identifier; a demodulator 326 to demodulate the modulated data from the base unit (20, shown in FIG. 1). The unique identifier helps the controller 200 to identify each floral object or location of each floral object.

In another embodiment of the present invention, the artificial intelligence is programmed and further depending on machine learning's classification—virtual personal assistant logs reports in blockchain structures or messages first responders or environmental interest groups.

The sensing circuits 34 may be configured as an artificial leaf that entangles contactless with the floral object 100 to spy on the patterns of biochemical processes as the result of environmental influences. The system (also termed as a SmartLeaf) also harvests energy from and with no harm for the plant (as a good sign of responsibility not to bring more toxic battery cells into burden mother nature).

Further, the electrodes 202 and 301 consists of recycled plastic mixed with carbon to be conductive. The emitting electrode 202 emits an alternating electric field that entangles with the floral object 100 in reach (as a kind of "capacitive coupling"). The floral object 100 mirrors the electrical charges and gets fully influenced.

The surface of the artificial SmartLeaf is also influenced and an integrated harvester circuit turns the charges into DC to operate battery-free (as Lithium is rare and toxic and therefore not environment friendly). The bioelectric processes inside the cells of floral objects 100 are an interaction between photons and electric fields(=photosynthesis), water, air, microorganisms, fungi, and minerals.

It is apparent to those skilled in the art that various components may be modified (or influenced) to stimulate a plant e.g. for healthier growth and/or more resistance against bugs and weather conditions, without deviating from the scope of the present invention. The system related stimulation via pattern modulated electron entanglement also has a positive genetic effect on a plant and therefore on its offspring in the form of enhanced seeds or more (for insects) attractive blossoms.

The plant 100 may have hundreds of thousands of such enhanced seeds that may grow into hundreds of thousands of plants which also have hundreds of thousands of seeds each. This could be a softer way into gene manipulation. The influenced plant's bioelectric reaction pattern is monitored, classified, and (modified) returned as a kind of (already scientifically proven) "floral biofeedback".

It should be understood, of course, that the foregoing relates to exemplary embodiments of the invention and that modifications may be made without departing from the spirit and scope of the invention as set forth in the following claims.

Although the inventions have been shown and described with respect to a certain embodiment or embodiments, equivalent alterations and modifications will occur to others skilled in the art upon the reading and understanding of this specification and the annexed drawings. In particular regard to the various functions performed by the above describe elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the inventions. In addition, while a particular feature of the inventions may have been described above with respect to only one or more of several illustrated embodiments, such feature may be combined with one or more other features of the other embodiments, as may be desired and advantageous for any given or particular application.

The invention claimed is:

1. A system for stimulating and communicating with floral objects, the system comprising:
   a base unit for communicating with the floral objects to read and stimulating physical and biological properties; and
   an electronic circuitry capacitively coupled to the base unit and the floral objects;
   wherein the base unit comprising:
      a generator for generating controllable frequency;
      a controller for releasing monitor commands and patterns to stimulate the floral objects;
      a mixer for mixing the controllable frequency with the commands and the patterns;
      an emitting electrode for emitting the mixed frequency with commands and patterns as an alternating electric field;
      an interface unit for communicating processed information over a communication network;
   wherein the electronic circuitry comprising:
      a coupling electrode influenced by the alternating electric field received from the emitting electrode;
      a power converter for converting the alternating electric field into a DC energy;
      a sensing circuitry to amplify bioelectric patterns received from the floral objects transported via the alternating electric field;
      a communication modem circuitry to extract the commands received from the controller via the alternating electric field; further the communication modem circuitry modulates the alternating electric fields with the amplified bioelectric pattern;
   a processing unit to interpret the extracted commands to adjust the amplification and filter values in the sensing circuitry in preparation to prepare the controller for stimulation of the floral objects;
   wherein the controller generates a stimulation pattern mixed the frequency by the mixer, wherein the emitting electrode emits the mixed stimulation pattern via the alternating electric field into the floral objects.

2. The system according to claim 1 wherein the electronic circuitry further comprising a buffer to store the converted DC energy, further the buffer removes ripples caused by the alternating electric field's frequency.

3. The system according to claim 1 further comprising one or more light emitting diodes to visualize operational status of the electronic circuitry.

4. The system according to claim 1 wherein the controller is programed with artificial intelligence to automatically create stimulation patterns based on the bioelectric patterns received by the sensing circuitry and interpret by the processing unit.

5. The system according to claim 4 wherein the base unit, the floral objects and the electronic circuitry are in a biofeedback loop to control stimulations in near real time.

6. The system according to claim 1 wherein the sensing circuit senses environmental changes affecting the floral objects, wherein the sensed environmental changes are communicated to the controller via the communication modem circuitry over the alternating electric field.

7. The system according to claim 1 wherein the stimulation patterns released from the controller enhances the growth of the floral objects naturally.

8. The system according to claim 1 wherein the stimulation patterns released from the controller attracts insects in reach of the alternating electric field for fertilizing the floral objects.

9. The system according to claim 1 wherein the stimulation patterns released from the controller repels harmful pests in reach of the alternating electric field to protect the floral objects.

10. The system according to claim 1 wherein the stimulation patterns released from the controller enhances properties of the floral object to bind more carbon dioxide.

11. The system according to claim 1 wherein the stimulation patterns released from the controller enhances properties of the floral object to release more oxygen.

12. The system according to claim 1, wherein the controller assigns a unique identification code to floral object.

13. A method for stimulating and communicating with floral objects, the method comprising the steps of:
   communicating with the floral objects to read and stimulating physical and biological properties via a base unit; and
   capacitively coupling the base unit and floral objects via an electronic circuitry;
   generating controllable frequency using a generator;
   releasing monitor commands and patterns to stimulate the floral objects using a controller;
   mixing the controllable frequency with the commands and the patterns using a mixer;
   emitting the mixed frequency with commands and patterns as an alternating electric field using an emitting electrode;
   communicating processed information over a communication network using an interface unit;
   influenced by the alternating electric field received from the emitting electrode using a coupling electrode;
   converting the alternating electric field into a DC energy using a power converter;
   amplifying bioelectric patterns received from the floral objects transported via the alternating electric field using a sensing circuitry;
   extracting the commands received from the controller via the alternating electric field; further the communication modem circuitry modulates the alternating electric fields with the amplified bioelectric pattern using a communication modem circuitry;

interpreting the extracted commands to adjust the amplification and filter values in the sensing circuitry in preparation to prepare the controller for stimulation of the floral objects using a processing unit;

generating a stimulation pattern by the controller mixed the frequency by the mixer, wherein the emitting electrode emits the mixed stimulation pattern via the alternating electric field into the floral objects.

14. The method according to claim 13 further comprising a step of storing the converted DC energy in a buffer, wherein the buffer removes ripples caused by the alternating electric field's frequency.

15. The method according to claim 13 further comprising a step of visualizing operational status of the electronic circuitry using light emitting diodes.

16. The method according to claim 13 further comprising a step of automatically creating stimulation patterns by programming the controller with artificial intelligence based on the bioelectric patterns received by the sensing circuitry and interpret by the processing unit.

* * * * *